United States Patent
Burggraf et al.

(10) Patent No.: US 9,296,193 B2
(45) Date of Patent: Mar. 29, 2016

(54) BENDABLE CARRIER MOUNT, DEVICE AND METHOD FOR RELEASING A CARRIER SUBSTRATE

(75) Inventors: Jürgen Burggraf, Schärding (AT); Daniel Burgstaller, Neuhofen im Innkreis (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 14/008,696

(22) PCT Filed: Apr. 11, 2011

(86) PCT No.: PCT/EP2011/055630
§ 371 (c)(1),
(2), (4) Date: Sep. 30, 2013

(87) PCT Pub. No.: WO2012/139627
PCT Pub. Date: Oct. 18, 2012

(65) Prior Publication Data
US 2014/0020847 A1 Jan. 23, 2014

(51) Int. Cl.
*B32B 38/10* (2006.01)
*B32B 43/00* (2006.01)
(Continued)

(52) U.S. Cl.
CPC ........ *B32B 43/006* (2013.01); *H01L 21/67092* (2013.01); *H01L 21/6835* (2013.01);
(Continued)

(58) Field of Classification Search
CPC B32B 38/10; B32B 43/006; Y10T 156/1168; Y10T 156/1978; Y10T 156/1137; Y10T 156/1189; Y10T 156/1939; Y10T 156/1972
See application file for complete search history.

(56) References Cited

U.S. PATENT DOCUMENTS 5,768,980 A * 6/1998 Degen ............................ 99/426
5,932,048 A 8/1999 Furukawa et al. ............ 156/153
(Continued)

FOREIGN PATENT DOCUMENTS

CN 102290367 12/2011 ............ H01L 21/687
CN 103460369 12/2013 ............. H01L 21/67
(Continued)

OTHER PUBLICATIONS

International Search Report for International Application No. PCT/EP2011/055630, Nov. 7, 2011.
(Continued)

*Primary Examiner* — Mark A Osele
*Assistant Examiner* — Nickolas Harm
(74) *Attorney, Agent, or Firm* — Kusner & Jaffe (57) ABSTRACT

A flexible carrier mount for mounting of a carrier substrate when the carrier substrate is detached from a product substrate, detachment means being provided for debonding the product substrate with bending of the carrier substrate. A device for detaching a carrier substrate from one product substrate in one detachment direction having: a carrier mount flexible in the detachment direction for mounting the carrier substrate, a substrate mount for mounting the product substrate, and detachment means for debonding the carrier substrate from the product substrate with bending of the carrier substrate. A method for detaching a carrier substrate from a product substrate in one detachment direction with the steps: mounting the product substrate with a substrate mount and mounting the carrier substrate with a carrier mount flexible in the detachment direction and debonding the carrier substrate from the product substrate with bending of the carrier substrate.

22 Claims, 5 Drawing Sheets

(51) Int. Cl.
*H01L 21/67* (2006.01)
*H01L 21/687* (2006.01)
*H01L 21/683* (2006.01)

(52) U.S. Cl.
CPC .... *H01L21/68707* (2013.01); *H01L 21/68721* (2013.01); *H01L 21/68785* (2013.01); *B32B 38/10* (2013.01); *H01L 2221/68381* (2013.01); *Y10T 156/1168* (2015.01); *Y10T 156/1978* (2015.01)

(56) References Cited

U.S. PATENT DOCUMENTS

| | | | |
|---|---|---|---|
| 6,343,784 B1 | 2/2002 | Jourde et al. | 269/187 |
| 8,157,615 B2 | 4/2012 | Thallner | 451/7 |
| 8,267,143 B2 | 9/2012 | George et al. | 156/758 |
| 8,366,873 B2 | 2/2013 | George | 156/707 |
| 8,530,334 B2 | 9/2013 | Lagahe et al. | 438/458 |
| 8,551,291 B2 * | 10/2013 | George | 156/706 |
| 8,722,515 B2 | 5/2014 | Lagahe et al. | 438/458 |
| 8,950,459 B2 | 2/2015 | George et al. | H01L 21/67282 |
| 2001/0014514 A1 | 8/2001 | Geusic | 438/455 |
| 2004/0040186 A1 * | 3/2004 | Wilson | 38/102.2 |
| 2004/0166653 A1 | 8/2004 | Kerdiles et al. | 438/458 |
| 2008/0305721 A1 | 12/2008 | Ohashi et al. | 451/41 |
| 2009/0258583 A1 | 10/2009 | Thallner | 451/289 |
| 2009/0314430 A1 | 12/2009 | Nakamura | 156/344 |
| 2010/0279435 A1 | 11/2010 | Xu | 438/5 |
| 2015/0096689 A1 | 4/2015 | Wimplinger et al. | 156/701 |

FOREIGN PATENT DOCUMENTS

| | | | |
|---|---|---|---|
| DE | 10 2008 018 536 | 10/2009 | H01L 21/673 |
| FR | 2 783 970 | 3/2000 | H01L 21/68 |
| JP | 2011-510495 | 3/2011 | H01L 21/02 |
| JP | 2012-4522 | 1/2012 | |
| TW | 200849582 A | 12/2008 | H01L 27/32 |
| WO | WO 00/76899 | 6/2000 | B66C 1/02 |
| WO | WO 2009/090236 | 7/2009 | H01L 21/20 |

OTHER PUBLICATIONS

Office Action issued in connection with corresponding Taiwanese Patent Application No. 101102305 (English-language translation included)dated Feb. 16, 2015.

Office Action issued in connection with corresponding Japanese Patent Application No. JP 2014-504141, dated Nov. 4, 2014.

U.S. Appl. No. 61/169,753, filed Apr. 16, 2009.

U.S. Appl. No. 61/552,140, filed Oct. 27, 2011.

Office Action issued in corresponding Japanese Patent Application No. 2014-547725, dated Nov. 16, 2015.

Office Action issued in connection with corresponding Chinese Patent Application No. CN 201180075733.6 dated Jan. 4, 2016.

\* cited by examiner

BENDABLE CARRIER MOUNT, DEVICE AND METHOD FOR RELEASING A CARRIER SUBSTRATE

FIELD OF THE INVENTION

The invention relates to a flexible carrier mount, a device for detaching a carrier substrate from a product substrate in one detachment direction L, a corresponding method and a use of a flexible carrier mount for mounting a carrier substrate in the debonding of a carrier substrate from a product substrate.

BACKGROUND OF THE INVENTION

In the semiconductor industry structure wafers or product wafers are often temporarily bonded to carrier wafers or carrier substrates in order to be able to handle them. After processing of the product substrates, they should be removed from the carrier substrate as easily, promptly, economically and cleanly as possible. The most frequently used method for bonding of product wafers on a carrier wafer is the application of an adhesion layer to one of the two substrates (or both substrates) and making contact under pressure. During debonding, the carrier wafer is debonded from the product wafer after reducing the adhesion force of the cement (temperature, UV radiation, etc.), for example by parallel shifting of the wafers against one another. The wafers are held by so-called chucks by negative pressure.

During debonding, a plurality of critical factors must be considered and the top priority is to expose the brittle product wafer which is very expensive due to preprocessing to as little stress as possible and to not damage it. The carrier substrate should be debonded on the other hand economically and promptly with as little energy consumption as possible. In a plurality of known debonding processes it is necessary, especially for breaking up the adhesion properties of the adhesion layer between the wafers, to heat the stack of carrier wafers and structure wafers/product wafers to a temperature which is specific to the cement.

SUMMARY OF THE INVENTION

The object of this invention is therefore to develop the generic devices and methods for debonding of carrier substrates such that careful debonding which is at the same time much quicker is enabled. At the same time the energy consumption will be reduced.

This object is achieved with the features of the independent claims(s). Advantageous developments of the invention are given in the dependent claims. All combinations of at least two of the features given in the specification, the claims and/or the figures also fall within the framework of the invention. At the given value ranges, values within the indicated limits will also be disclosed as boundary values and will be claimed in any combination.

The basic idea of this invention is to engineer a carrier mount for mounting of the carrier substrate in the detachment of the carrier substrate from the product substrate such that the carrier mount is made to allow bending of the carrier substrate. The carrier mount has a bending stiffness which is sufficient to cause a detachment force for debonding of the carrier substrate from the product substrate, especially by lifting from the edge of the carrier substrate.

According to the present invention, only a slight bowing should occur, especially <45° bending angle, preferably <40°, more preferably <30°, especially preferably <20°, even more preferably <10°, most preferably <5°. In this way the carrier substrate which also has a certain bending stiffness which is similar to the carrier mount, and above all the product substrate are protected against damage. Bending causes most of the detachment force on the migrating detachment front which migrates especially from the edge of the carrier substrate in the direction of the center.

The heart of the invention is therefore a flexible carrier mount for mounting of a carrier substrate in the detachment of the carrier substrate from a product substrate, detachment means being provided for debonding of the product substrate with bending of the carrier substrate on the carrier mount.

Therefore blanket, non-annular versions of the carrier mount, especially of a polymer with a certain elasticity or bending strength, are also conceivable. To fix and hold the carrier substrate they would have vacuum passages. In this connection, especially in addition to increasing the holding force, there can be electrostatic fixing of the carrier substrate on the carrier mount.

The carrier mount can also consist at least partially of metal, ceramic or a composite material. The materials used need allow only the functionality as described herein.

An independent invention is moreover a device for detaching a carrier substrate from a product substrate in one detachment direction L with the following features: a carrier mount which is flexible in the detachment direction L for mounting of the carrier substrate,—a substrate mount for mounting of the product substrate, detachment means for debonding of the carrier substrate from the product substrate with bending of the carrier substrate.

The detachment direction L is essentially, in particular exactly, normal to the surface of the carrier substrate and/or product substrate. One bending axis of the bending of the carrier mount and/or of the carrier substrate held by the carrier mount is normal to the detachment direction L. The bending axis is especially parallel to the surface of the product substrate and/or of the carrier substrate.

In one advantageous version of the present invention the device can advantageously comprise a pressure chamber which can be exposed to overpressure in order to fix a carrier substrate which has been fixed with negative pressure on the carrier mount more strongly to it. The pressure in the chamber can be >1 bar, preferably >2 bar, even more preferably >5 bar, still more preferably >10 bar, especially less than 100 bar.

According to one advantageous embodiment of the invention it is provided that the carrier mount is elastically deformable in the detachment direction L. The elasticity of the carrier mount makes it possible to concentrate the detachment force on the migrating detachment front, although a tensile force is applied only on the periphery of the carrier substrate.

In another advantageous version of the invention it is provided that at least one tensile force acting on the periphery of the substrate mount and at least one opposing force acting against the tensile force on the periphery of the carrier mount can be applied by the detachment means to produce detachment moments along one detachment front. In this way the total load, especially at the start of debonding, can be reduced. In this way greater protection of the carrier substrate and of the product substrate is afforded. It is provided in particular that the tensile forces add up, especially by uniform application of tensile forces on the periphery of the substrate mount, to a resulting tensile force in the center of the substrate mount, while the opposing force or the opposing forces add up to a resulting opposing force on one edge of the carrier mount and corresponding detachment moments on the migrating detachment front. The carrier mount is accordingly tilted relative to the substrate mount.

For better protection of the product substrate, especially for very sensitive or very expensive product substrates, it is provided that the substrate mount be made as a rigid receiver which holds the product substrate over the entire surface.

According to another advantageous embodiment of the invention, it is provided that the carrier mount be made as an especially open ring with an adjustable inside diameter $D_i$. The bending stiffness can be optimally adjusted to the carrier substrate due to the ring shape also by the ring geometry, especially the ring width B to the ring diameter $D_a$, and/or to the height H of the ring. The ring shape furthermore results in that in the region of the ring opening greater freedom of motion of the carrier substrate is allowed so that an interaction of the bending stiffness of the carrier mount and the bending stiffness of the carrier substrate is achieved. Here the bending stiffness of the carrier mount is especially at least equal to or greater than the bending stiffness of the carrier substrate.

The bending stiffness of the carrier mount is advantageously chosen such that it lies in a range between 1/20 to 20 times, especially between 1/10 to 10 times, preferably between 1/5 to 5 times, even more preferably between 1/2 to 2 times, the bending stiffness of the carrier substrate. The carrier substrate is especially a wafer of silicon with a thickness d between 500 μm and 750 μm, preferably of 600 μm. It can have a diameter $D_t$ of 200 mm or 300 mm.

Here it is especially advantageous to provide holding means which run especially over the entire ring periphery, especially in the form of a rebounding peripheral shoulder. Thus, with a simple geometrical shape which can be economically produced, both the detachment force can be applied to the carrier substrate, especially on the entire periphery of the carrier substrate, and the especially critical initiation of the detachment front at the start of debonding can be concentrated at one or more sites on the periphery of the carrier substrate.

In one development it is provided that the carrier mount is made to laterally surround the carrier substrate essentially completely, especially at least to 98% of the periphery, preferably at least to 99%, even more preferably to at least 99.5%. In this way the carrier substrate is supported more or less over the entire periphery. The carrier mount is made especially as a ring which is peripherally closed preferably at least up to 98% of the periphery, even more preferably at least to 99%, still more preferably at least to 99.5%. The ring can also be composed of individual sections.

According to one advantageous embodiment, the detachment means have translational drive means for causing a translation movement of at least one peripheral section of the carrier mount in the detachment direction L.

An independent invention is a method for detaching a carrier substrate from a product substrate in one detachment direction L with the following steps, especially the following sequence: mounting of the product substrate with a substrate mount and mounting of the carrier substrate with a carrier mount which is flexible in the detachment direction L and debonding of the carrier substrate from the product substrate with bending of the carrier substrate.

Furthermore, there is a use of a flexible carrier mount for mounting of a carrier substrate when the carrier substrate is debonded from a product substrate.

In one advantageous embodiment of the invention it is provided that the debonding takes place at a temperature <200° C., preferably <100° C., even more preferably <50° C., ideally at ambient temperature, especially without blanket heating means.

It is conceivable to accelerate the debonding, especially on the detachment front, by action of the detachment means, especially by separating means, locally on the detachment front. The separating means can comprise mechanical separation and/or local heating, preferably a directed hot air flow. Specifically a separating wedge, a separating blade, a separating wire or a preferably hot compressed air jet directed at the detachment front can be provided individually or in combination.

A separating wedge is defined as a tool with a preferably v-shaped profile. A separating blade is defined as a tool with an extremely sharp edge. The separating wire is a very thin, preferably high strength wire which is moved by a corresponding apparatus in the tensioned state in the plane of the intermediate layer toward it. The separating wire is made especially as a heated wire, therefore able to be heated.

In one embodiment of the invention it is also conceivable in which the detachment front runs more or less in a spiral during the detachment along the periphery of the product substrate to the inside toward the center. This is achieved by the detachment forces which are acting on the periphery being increased running around the periphery.

The described features apply analogously to the device of the present invention and the method of the present invention as well as the use of the present invention.

Other advantages, features and details of the invention will become apparent from the following description of preferred exemplary embodiments and using the drawings:

BRIEF DESCRIPTION OF THE DRAWINGS

The same components or components with the same function are identified with the same reference numbers in the figures.

DETAILED DESCRIPTION OF THE INVENTION

Figure 1:
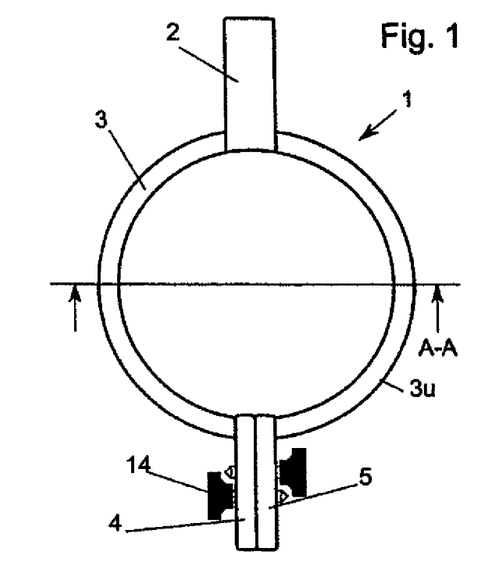
FIG. 1 shows a plan view of one carrier mount according to the present invention with a cutting line A-A.
Figure 2:
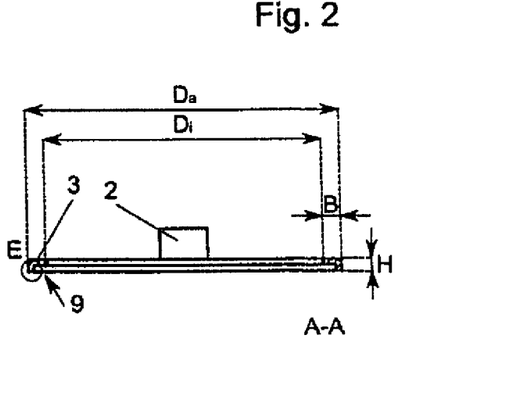
FIG. 2 shows a cross sectional view of the carrier mount according to cutting line A-A from FIG. 1.
Figure 3:
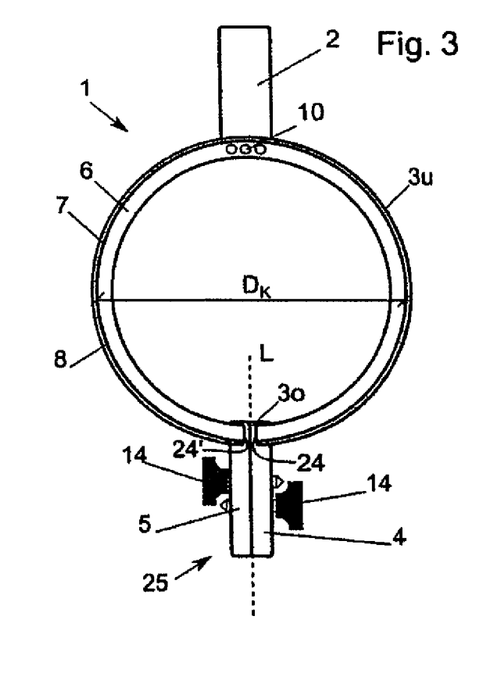
FIG. 3 shows a view of the carrier mount according to FIG. 1 from underneath.
Figure 4:
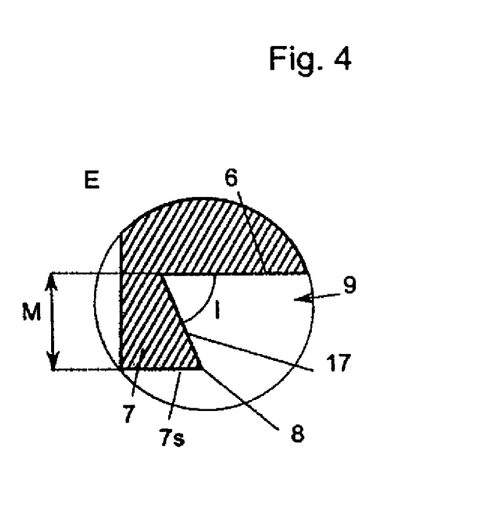
FIG. 4 shows a detailed view of detail E from FIG. 2.

FIG. 1 shows a carrier mount 1 which can be used semi-automatically, and in which the carrier substrate 13 is held manually by the carrier mount 1. The carrier mount 1 is used for debonding the carrier substrate 13 from a product substrate 11 which is connected to the carrier substrate by an interconnect layer 12.

The carrier mount 1 is comprised of a holding handle 2 which is located on one peripheral section 26 and of a ring 3 which is opened opposite the holding handle 2. On the opening 3o of the ring 3 there are spacing means 25 for adjustment of the spacing A between the ends 24, 24' on the opposite ends 24, 24' of the ring 3. An inside diameter $D_i$ and an outside diameter $D_a$ of the ring 3 can be adjusted by adjusting the spacing A. The spacing means 25 in this exemplary embodiment is comprised of levers 4, 5, the lever 4 being attached on the end 24 and the lever 5 on the end 24'. The levers 4, 5 are penetrated by positioning elements 14 which can be operated manually here. Automatic re-positioning of the above described manual kinematics is conceivable.

The holding handle 2 is attached to the ring 3 by fixing elements 10, especially screws. The material of the ring 3 for a given geometry (ring height H, ring width B, outside diameter $D_a$, inside diameter $D_i$) should be chosen such that the ring 3 can be elastically bent by the spacing means 25 against its force caused by the bending stiffness.

Figure 6:
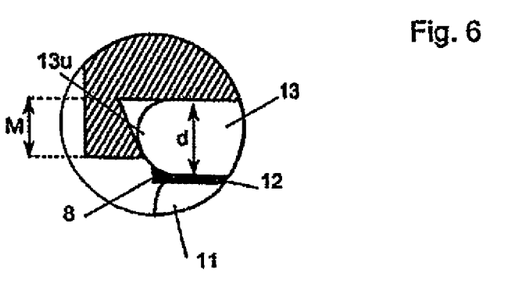
FIG. 6 shows a detailed view analogously to FIG. 4 with a first embodiment of the carrier mount.

The ring 3 has a peripheral shoulder 7 which projects away from a ring shoulder 6, and a step 9. The step 9 runs in a z-shape with an inside angle $45°<I<90°$, especially $<80°$, preferably $<70°$ pointed toward the middle of the ring and thus forms an especially peripherally running wall bevel 17 which ends on a sharp inner edge 8. The inner edge 8 is at the same time a component of a face surface 7s of the peripheral shoulder 7, which surface runs parallel to the ring shoulder 6. The face surface 7s is equidistant to the ring shoulder 6 with a distance M. The distance M is chosen such that it is at most slightly larger, especially at most larger by the thickness of the interconnect layer 12, than one thickness d of the carrier substrate 13 (see FIG. 7). Preferably the distance M is chosen as shown in FIG. 6 such that it is smaller than the thickness d of the carrier substrate 13. Preferably the distance M is at least half as great as the thickness d of the carrier substrate 13.

A diameter $D_k$ which lies between the inside diameter $D_i$ and the outside diameter $D_a$ for holding the carrier substrate 13 and which is formed by the inner edge 8 can be increased by the spacing means 25 until the carrier substrate 13 can be inserted through an opening (diameter $D_k$) formed by the inner edge 8 as far as the ring shoulder 6. Then the diameter $D_k$ can be again reduced by the spacing means 25 until one peripheral edge 13u of the carrier substrate 13 adjoins the bevel 17 of the peripheral shoulder 7 and is fixed by it. Thus the carrier substrate 13 is held by the flexible carrier mount 1. The mounting takes place more or less by clamping and/or by form fit. For clamping of the carrier substrate 13 on the bevel 17 there can be dynamometer means for control of the clamping, especially on the positioning means 14.

The product substrate 11 is only attached to the carrier mount 1 via the interconnect layer 12. There is no direct contact between the carrier mount 1 and the product substrate 11. While avoiding contact between the carrier mount 1 and the product substrate 11 the product substrate 11 is protected to the maximum degree and contamination or damage is essentially precluded.

Figure 5A:
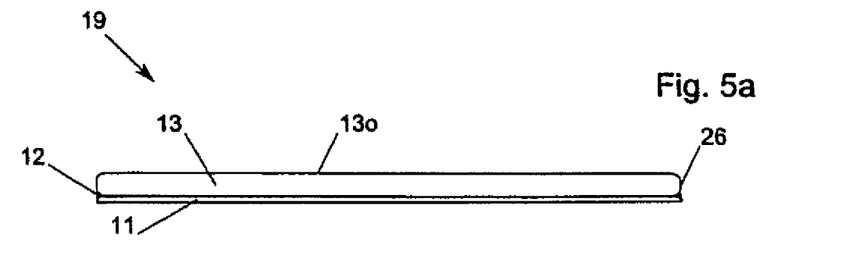
FIG. 5a shows a side view of a stack composed of the carrier substrate, interconnect layer and product substrate.
Figure 5B:
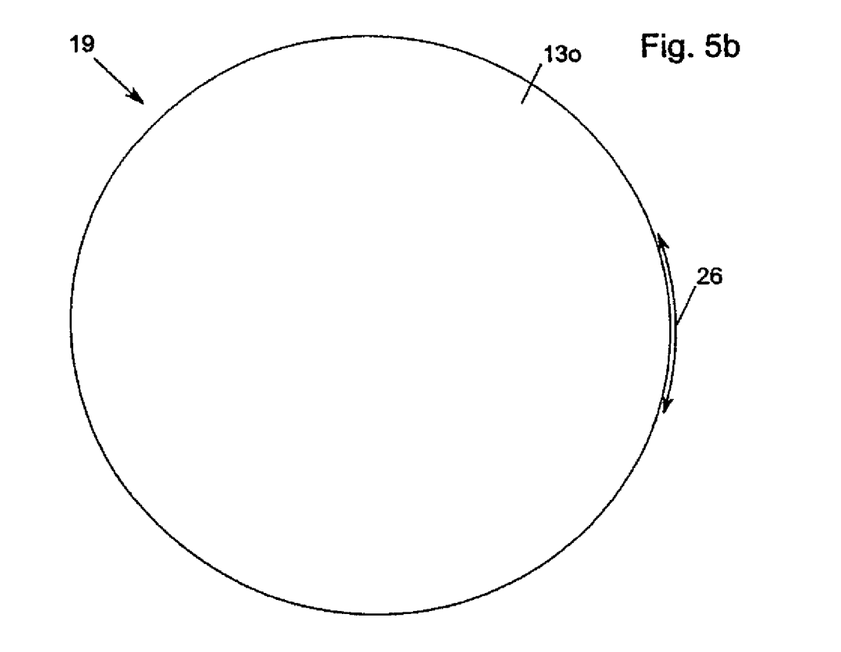
FIG. 5b shows a plan view of a stack composed of the carrier substrate, interconnect layer and product substrate.

The product substrate 11 with the interconnect layer 12 and the carrier substrate 13 forms a stack 19 (carrier substrate—product substrate—combination). This invention is likewise suited for a combination of carrier substrate and product substrate without interposed interconnect layer, especially for so-called prebonds, in which the wafers adhere to one another especially by means of Van der Waals forces.

Figure 7:
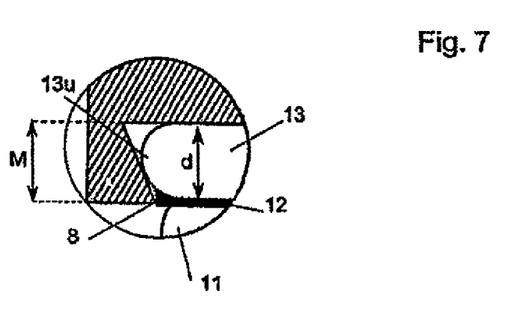
FIG. 7 shows a detailed view analogously to FIG. 4 with a second embodiment of the carrier mount.

When fixing the stack 19 on the carrier mount 1 in the embodiment shown in FIG. 7 the sharp inner edge 8 is used at the same time as a separating means or to initiate debonding by the tip of the inner edge 8 on the peripheral edge of the interconnect layer 12 penetrating into the interconnect layer 12.

The carrier mount 1 almost completely surrounds the carrier substrate 13, except for the ring opening 3o.

Figure 8:
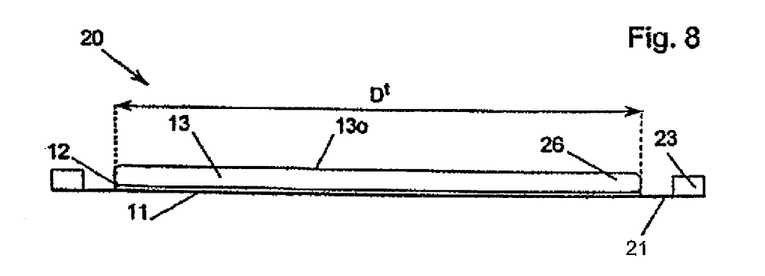
FIG. 8 shows a stack fixed on a film frame.

FIG. 8 shows the stack 19 on a film frame 23, the product substrate 11 being connected to a film 21 which is joined to the film frame 23. The stack 19, the film frame 23 and the film 21 form a film frame combination 20.

The carrier substrate 13 can be pulled off the product substrate 11 by means of the holding handle 2 and by fixing of the product substrate 11 or of the film frame 23. The tensile force is applied laterally to the carrier substrate 13, therefore to the peripheral section 26 by the unilateral arrangement of the holding handle 2. Initiated by the penetration of the inner edge 8 into the interconnect layer 12, the carrier substrate 13 with deformation of the carrier substrate 13 and of the ring 3 (against its force produced by the bending stiffness) is slowly debonded proceeding from the peripheral section 26 to the opposite side. Here a detachment front migrates from the peripheral section 26 to the opposite side of the carrier substrate 13 by the interconnect layer 12. Accordingly, depending on the distance of the detachment front from the holding handle 2 and the detachment force applied to the holding handle 2, defined torques act along the detachment front.

In automated form this is shown in FIGS. 9a to 9d in a first embodiment and in FIGS. 10a to 10d in a second embodiment, which are detailed below.

The use of the above described carrier mount 1 for mounting of the carrier substrate 13 in a form suitable for automation is common to the two embodiments.

One important aspect of the invention consists in providing especially careful handling at the start of debonding, therefore when debonding is initiated, especially by implementation of a mechanical debonding of the interconnect layer on the periphery or on its edge.

FIGS. 9 and 10 each show one base 27 and one rack 22 which is mounted on it for providing a stable base construction and for attachment of other components of the device, which are described below. On the rack 22 or the base 27, especially between a cover 22d of the rack 22 and a bottom 27b formed by the base 27, there are drive means 15' for translational movement (especially driven) of the carrier mount 1 or of peripheral sections of the carrier mount 1 and drive means 15 for translational movement (especially driven) of a substrate mount 18 (receiver) which holds the stack 19 or the film frame combination 20. The drive means 15' can have a trip-free mechanism in the direction of translation, especially formed by a movable bearing.

The substrate mount 18 in the two embodiments as shown in FIG. 9 and FIG. 10 can be moved up and/or down in translation in one detachment direction L, therefore in the plane of the drawing. The drive means 15 for driving the substrate mount 18 can thus be moved especially synchronously, preferably driven by motors, especially stepping motors, which are controlled by a central control device.

Figure 9A:
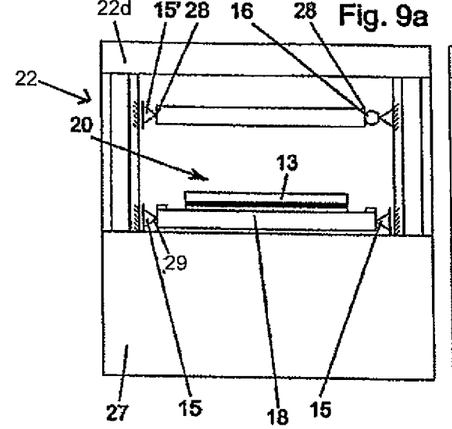
FIGS. 9a-9d show a first embodiment of the device with four method steps and FIGS. 10a-10d show a second embodiment of the device with four method steps.

In the embodiment as shown in FIG. 9, for the carrier mount 1 there is only one drive means 15' on the side of the carrier mount 1 opposite the peripheral section 26, while on the peripheral section 26 there is one rocker bearing 16, so that the carrier mount can be pivoted around the rocker bearing 16, but is fixed in the detachment direction L. Thus the sequence of the method is as follows:

In the method step shown in FIG. 9a, the carrier mount 1 which is suitable for the film frame combination 20, especially the carrier substrate 13, is attached to the upper drive means 15' and the rocker bearing 16. At the same time, beforehand or subsequently, the film frame combination 20 is fixed onto the substrate mount 18, in particular by application of a vacuum. The substrate mount 18 can be moved by the drive means 15 in the detachment direction L.

It is alternatively conceivable that on the periphery of the carrier mount 1 there are several, especially two, drive means 15' on one side and several, especially two, rocker bearings 16 on the opposite side.

The carrier mount 1 can be fixed by holding means 28 which are located on the ring periphery 3u on the drive means 15' and the rocker bearing 16. The substrate mount 18 can be fixed by holding means 29 on the drive means 15.

Figure 9B:
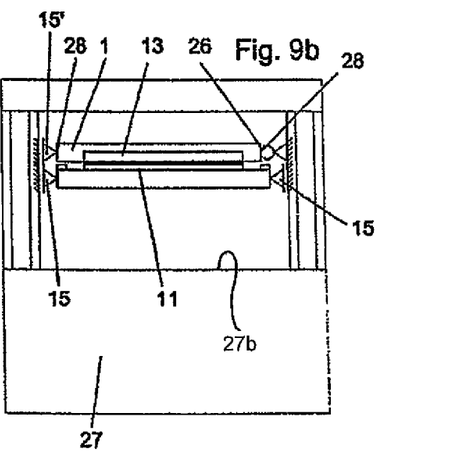

Then the substrate mount 18 is moved into the position shown in FIG. 9b (therefore in the detachment direction L toward the carrier mount 1) by the drive means 15 executing a synchronous translational movement of the substrate mount 18 until the carrier substrate 13 with its top 13o adjoins the ring shoulder 6. Control can take place via the central control device, the detection of the carrier substrate 13 striking the ring shoulder 6 taking place by force transducers which are integrated especially into the substrate mount 18. Preferably on the periphery of the substrate mount 18 there are a number n of force transducers distributed at an angular distance of $360°/n$.

So that the carrier substrate 13 can be held in the carrier mount 1, the diameter $D_k$ must be matched accordingly beforehand to the inner edge 8 of the ring 3 so that the carrier substrate 13 with its outside contour (especially circular with a diameter $D_t$) can be received into the carrier mount 1. When the carrier mount 13 is received the inside diameter $D_i$ is smaller than the diameter $D_t$ of the carrier substrate 13 so that the carrier substrate 13 does not slip through. As soon as the position shown in FIG. 9b is reached, the inside diameter $D_i$ can be reduced until the carrier substrate 13 is fixed in the carrier mount 1 (see FIGS. 6 and 7), and therefore adjoins the wall bevel 17.

As soon as the position which is shown in FIG. 9b is reached, the upper fixable drive means 15' is released so that it has a degree of freedom in the detachment direction L and the side of the carrier mount 1 attached to the drive means 15' can move freely in the detachment direction L. In this embodiment the drive means 15' is made driveless. But a control of the motion by the central device is also conceivable so that the drive means 15' is made not passive (as in the preferred embodiment), but active.

Then, on the two drive means 15 which are provided opposite on the substrate mount 18 one drive force $F_1$ (tensile force) which is pointed away from the carrier mount 1 and one drive force $F_2$ (tensile force) which is especially identical to the drive force $F_1$ are applied especially synchronously to the substrate mount 18 for debonding of the carrier substrate 13 which is fixed on the carrier mount 1 from the product substrate 11.

Acting opposite the drive forces $F_1$ and $F_2$ and especially parallel to them, an opposing force G (or several opposing forces G, if there are several rocker bearings 16) is applied to the rocker bearing 16.

In this way the debonding process which has been initiated from the inner edge 8 is continued, with increasing bending of the carrier mount 1 and of the carrier substrate 13 a detachment front running from the rocker bearing 16 to the opposite side of the carrier mount 1. In equilibrium with the drive forces $F_1$ and $F_2$ as well as the opposing force G (caused by the interconnecting force of the interconnect layer 12), torques act along the detachment front as detachment moments $K_1$ to $K_n$ which are distributed infinitesimally along the detachment front.

Figure 9C:
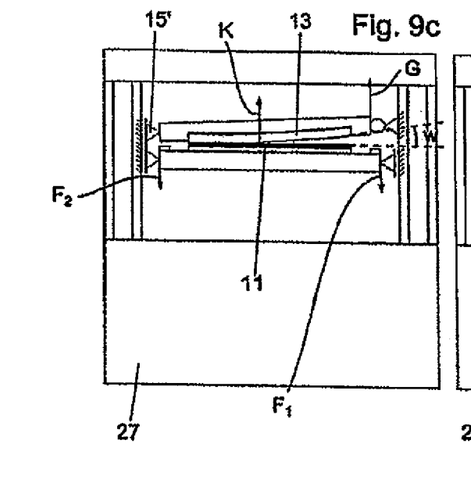

In the position shown in FIG. 9c, the carrier substrate 13 is debonded by more than half, debonding taking place by both the carrier substrate 13 and also the carrier mount 1 deforming (against the bending strength of the carrier mount 1 and of the carrier substrate 13).

Figure 9D:
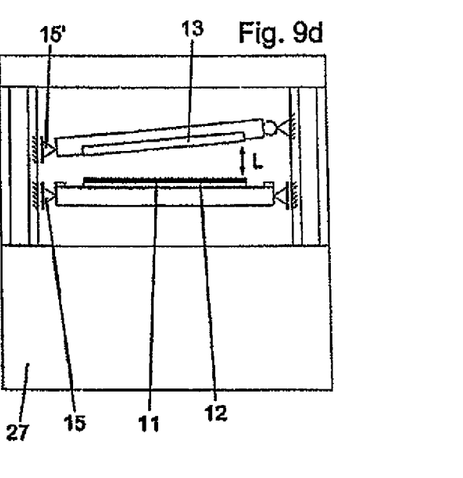
Figure 10A:
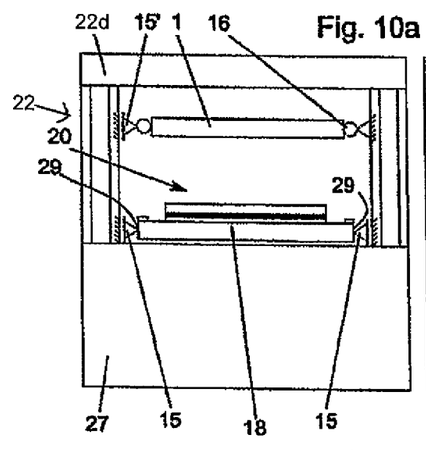
Figure 10B:
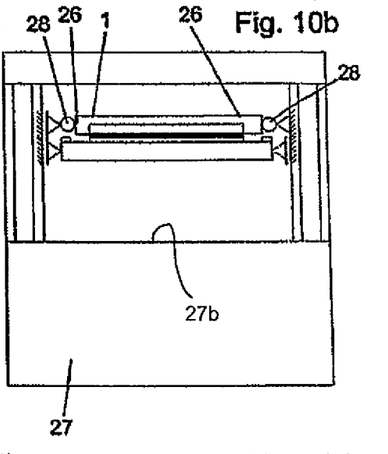
Figure 10C:
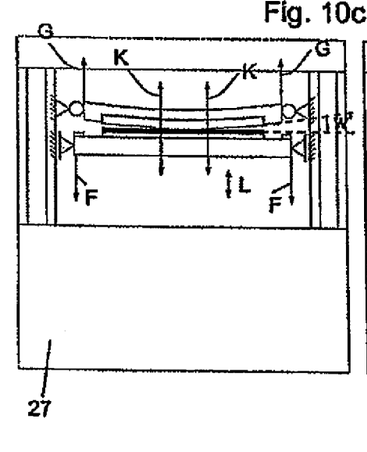
Figure 10D:
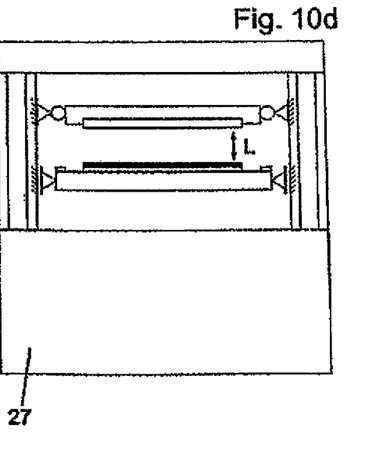

In the position shown in FIG. 9d, the carrier substrate 13 is debonded completely from the product substrate 11. The interconnect layer 12 in the figure adheres to the product substrate 11, but can also adhere partially or completely to the carrier substrate 13.

During the debonding, the carrier mount 1 and the carrier substrate 13 bend by an (average, especially measured at half debonding of the carrier substrate 13 from the product substrate 11) bending angle $1°<W<45°$, especially $W<35°$, here roughly $6°$.

In the second embodiment as shown in FIG. 10a to FIG. 10d, instead of the drive means 15' there is a rocker bearing 16 on the carrier mount 1 so that the carrier mount 1 on the peripheral sections 26 and an opposite peripheral section 26' (therefore where the rocker bearings 16 are attached to holding means 28 of the carrier mount 1) is fixed in the detachment direction L (there can be several rocker bearings 16 on the periphery of the carrier mount 1). In sections between the peripheral sections 26 the carrier mount 1 is movable within the framework of its flexibility against the bending stiffness. Thus when the drive forces are applied in the method step according to 10c, a detachment front which runs essentially (rippled) concentrically from the periphery of the interconnect layer 12 arises to the middle of the interconnect layer 12. Here the initiation by the inner edge 8 of the carrier mount plays an important part for overcoming the initial interconnecting force of the interconnect layer 12.

The detachment moments $K_1$ to $K_n$ act in the embodiment as shown in FIGS. 10a to 10d each predominantly on one (rippled) circular section along the detachment front as the detachment front progresses. While the bending angle W according to FIG. 9c to the side edge opposite the rocker bearing is measured, the bending angle W' is measured from the center of the carrier substrate 13 to the edge due to the detachment force K which acts on the periphery from all sides, the bending angle W' in this case being correspondingly smaller due to the shorter distance, insofar as the material of the carrier mount 1 and of the carrier substrate 2 as well as their dimensions are otherwise identical. By reducing the ring width B and/or the ring height H the bending stiffness of the ring 3 can be reduced so that the bending angle W' would be increased.

REFERENCE NUMBER LIST

1 carrier mount
2 holding handle
3 ring
3o opening
3u ring periphery
4 lever
5 lever
6 ring shoulder
7 peripheral shoulder
7s face surface
8 inner edge
9 step
10 fixing elements
11 product substrate
12 interconnect layer
13 carrier substrate
13o top
13u peripheral edge
14 positioning elements 15, 15' drive means
16 rocker bearing
17 bevel
18 substrate mount
19 stack
20 film frame combination
21 foil
22 rack
22d cover
23 film frame
24, 24' ends
25 spacing means
26 peripheral section
27 base
27b bottom
28 holding means
29 holding means
A spacing
B ring width
$D_i$ inside diameter
$D_a$ outside diameter
$D_k$ diameter
H ring height
M distance
L detachment direction
I inner angle
d thickness
$F_1, F_2, F_n$ drive forces (tensile force)
G opposing force
$K_1, K_2, K_n$ detachment moments
W, W' bending angles

The invention claimed is:

1. Device for detaching a carrier substrate from a semiconductor product substrate in a detachment direction (L) wherein said detachment direction (L) is generally normal to a planar surface of said semiconductor product substrate, said device comprising:
 a carrier mount for holding the carrier substrate, said carrier mount including:
  an open ring that is flexible in the detachment direction (L) and configured to bend relative to said planar surface of the semiconductor product substrate such that at least one side of the open ring is offset above a remaining portion of the open ring to bend the carrier substrate, said open ring of said carrier mount having an adjustable diameter ($D_k$),
 a substrate mount for holding the semiconductor product substrate, and
 detachment means for debonding of the carrier substrate from the semiconductor product substrate while bending the carrier substrate in said detachment direction (L), said detachment means including:
  drive means for applying at least one tensile force ($F_1, F_2, F_n$) to said substrate mount in said detachment direction (L) and
  fixing means for applying at least one opposing force (G) to said carrier mount in a direction generally opposite said at least one tensile force ($F_1, F_2, F_n$).

2. Device as claimed in claim 1, wherein the carrier mount is elastically deformable in the detachment direction (L).

3. Device as claimed in claim 1, wherein said drive means of said detachment means applies said at least one tensile force ($F_1, F_2, F_n$) on the periphery of the substrate mount and said fixing means of said detachment means applies said at least one opposing force (G) acting against the tensile force ($F_1, F_2, F_n$) on the periphery of the carrier mount to produce detachment moments ($K_1, K_2, K_n$) along a detachment front.

4. Device as claimed in claim 1, wherein the substrate mount is a rigid substrate mount having a surface that engages an entire surface of the semiconductor product substrate.

5. Device as claimed in claim 1, wherein said detachment direction (L) extends in a generally vertical direction and said drive means of said detachment means moves said substrate mount in said detachment direction (L).

6. Device as claimed in claim 1, wherein said drive means applies said at least one tensile force ($F_1, F_2, F_n$) to said substrate mount in said detachment direction (L) and said fixing means applies said at least one opposing force (G) to said carrier mount to fix at least one side of said carrier mount relative to said detachment direction (L).

7. Device as claimed in claim 1, further comprising a control device that controls operation of the detachment means and thereby controls application of a plurality of said tensile forces ($F_1, F_2, F_n$) to the substrate mount, wherein each of said plurality of said tensile forces ($F_1, F_2, F_n$) is applied at different locations on a periphery of the substrate mount to debond the carrier substrate from the semiconductor product substrate concentrically from the periphery of the semiconductor product substrate to a center of the semiconductor product substrate.

8. Device as claimed in claim 1, further comprising a control device that controls operation of the detachment means and thereby controls application of a plurality of said tensile forces ($F_1, F_2, F_n$) to the substrate mount, wherein each of said plurality of said tensile forces ($F_1, F_2, F_n$) is applied at different locations on a periphery of the substrate mount to debond the carrier substrate from the semiconductor product substrate in a spiral pattern from the periphery of the semiconductor product substrate to a center of the semiconductor product substrate.

9. Device as claimed in claim 1, wherein said open ring includes:
 an inside surface defining a first opening having an inside diameter ($D_i$);
 a ring shoulder providing a lower surface; and
 a peripheral shoulder extending away from the ring shoulder, said peripheral shoulder comprised of:
  (i) a face surface extending generally parallel to the lower surface of the ring shoulder, and
  (ii) a sloping surface extending between the face surface and the lower surface of the ring shoulder, said sloping surface meeting the face surface at an inner edge, wherein said sloping surface defines a second opening having a diameter that increases from the face surface to the lower surface of the ring shoulder and wherein the adjustable diameter ($D_k$) is defined by the inner edge.

10. Method for detaching a carrier substrate from a substantially planar semiconductor product substrate in a detachment direction (L) wherein said detachment direction (L) is generally normal to a substantially planar surface of said semiconductor product substrate, said method comprising:
 mounting the semiconductor product substrate to a substrate mount;
 mounting the carrier substrate to a carrier mount which is flexible in the detachment direction (L) for bending of the carrier substrate, said carrier mount including an open ring with an adjustable diameter ($D_k$);
 applying at least one tensile force ($F_1, F_2, F_n$) to said substrate mount in a first direction; and
 applying at least one opposing force (G) to said carrier mount in a second direction, said first direction being generally opposite to said second direction, wherein the carrier substrate mounted to the carrier mount bends in the detachment direction (L) to detach the carrier substrate from the semiconductor product substrate.

11. Method as claimed in claim 10, wherein said detachment direction (L) extends in a generally vertical direction and said substrate mount moves in said detachment direction (L).

12. Method as claimed in claim 10, wherein at least one side of said carrier mount is fixed to a predetermined position relative to said detachment direction (L) and at least one opposite side of said carrier mount is free to move in the detachment direction (L).

13. Flexible carrier mount for holding a carrier substrate in a process for detaching the carrier substrate from a semiconductor product substrate connected thereto, wherein the carrier mount is engageable by detachment means to bend the carrier substrate held by the carrier mount and thereby debond the carrier substrate from the semiconductor substrate, said carrier mount comprising:
an open ring including:
an inside surface defining a first opening having an inside diameter ($D_i$);
a ring shoulder providing a lower surface; and
a peripheral shoulder extending away from the ring shoulder, said peripheral shoulder comprised of:
(i) a face surface extending generally parallel to the lower surface of the ring shoulder, and
(ii) a sloping surface extending between the face surface and the lower surface of the ring shoulder, said sloping surface meeting the face surface at an inner edge, wherein said sloping surface defines a second opening having a diameter that increases from the face surface to the lower surface of the ring shoulder, the second opening having a diameter ($D_k$) defined by the inner edge.

14. Flexible carrier mount as claimed in claim 13, wherein an angle (I) between the sloping surface of the peripheral shoulder and the lower surface of the ring shoulder is greater than 45° and less than 90°.

15. Flexible carrier mount as claimed in claim 13, wherein said lower surface of the ring shoulder, the sloping surface of the peripheral shoulder, and the face surface of the peripheral shoulder form a Z-shaped step.

16. Flexible carrier mount as claimed in claim 13, wherein a distance (M) between the lower surface of the ring shoulder and the face surface of the peripheral shoulder is in a range from about 250 μm to about 750 μm.

17. Flexible carrier mount as claimed in claim 13, wherein said open ring includes an outside surface having an outside diameter ($D_a$), wherein $D_i<D_k<D_a$.

18. Flexible carrier mount as claimed in claim 13, wherein said carrier mount further comprises:
spacing means for adjusting the diameter ($D_k$) of the second opening, wherein the diameter ($D_k$) of the second opening is greater than the diameter ($D_i$) of the first opening.

19. Flexible carrier mount as claimed in claim 13, wherein said open ring includes first and second opposing ends, wherein there is a spacing (A) between the first and second opposing ends.

20. Flexible carrier mount as claimed in claim 19, wherein said carrier mount further comprises:
spacing means for adjusting a size of the spacing (A), and thereby adjusting the inside diameter ($D_i$) of the first opening.

21. Flexible carrier mount as claimed in claim 20, wherein said spacing means includes first and second levers operable to modify the size of the spacing (A).

22. Flexible carrier mount as claimed in claim 13, wherein the carrier mount further comprises:
a handle attached to the open ring.

* * * * *